(12) United States Patent
Suzuki (10) Patent No.: US 11,503,753 B2
(45) Date of Patent: Nov. 15, 2022

(54) SUBSTRATE PROCESSING MANAGEMENT SYSTEM

(71) Applicant: FUJI CORPORATION, Chiryu (JP)

(72) Inventor: Toshiya Suzuki, Toyota (JP)

(73) Assignee: FUJI CORPORATION, Chiryu (JP)

( * ) Notice: Subject to any disclaimer, the term of this patent is extended or adjusted under 35 U.S.C. 154(b) by 414 days.

(21) Appl. No.: 16/633,762

(22) PCT Filed: Jul. 25, 2017

(86) PCT No.: PCT/JP2017/026790
§ 371 (c)(1),
(2) Date: Jan. 24, 2020

(87) PCT Pub. No.: WO2019/021361
PCT Pub. Date: Jan. 31, 2019

(65) Prior Publication Data
US 2020/0375076 A1    Nov. 26, 2020

(51) Int. Cl.
*B23P 19/00*    (2006.01)
*H05K 13/08*    (2006.01)
*G06T 7/00*    (2017.01)

(52) U.S. Cl.
CPC ....... *H05K 13/0882* (2018.08); *G06T 7/0004* (2013.01); *H05K 13/081* (2018.08);
(Continued)

(58) Field of Classification Search
CPC ........ G06T 2207/30141; G06T 7/0004; H05K 13/0815; H05K 13/083; H05K 13/0895; H05K 13/0882
See application file for complete search history.

(56) References Cited

U.S. PATENT DOCUMENTS

2015/0243108 A1   8/2015   Nakayama
2015/0286202 A1   10/2015   Amano et al.

FOREIGN PATENT DOCUMENTS

EP   2 355 646 A2   8/2011
EP   2 902 861 A1   8/2015
(Continued)

OTHER PUBLICATIONS

Extended European Search Report dated Jun. 22, 2020 in Patent Application No. 17919346.1, 9 pages.
(Continued)

*Primary Examiner* — Paul D Kim
(74) *Attorney, Agent, or Firm* — Oblon, McClelland, Maier & Neustadt, L.L.P.

(57) ABSTRACT

The substrate processing management system for a substrate processing line including a defect tallying section to calculate a defect rate representing a rate of occurrence of substrates or electronic components determined to be defective with the substrate inspection machine, or obtain a number of defective products having substrates or electronic components determined to be defective; an attribute change recognition section to recognize when an attribute, among the attributes of the electronic component, having a possibility of affecting the inspection, has changed in the component mounting machine; a fault point estimation section to estimate, when the defect rate or the number of defective products exceeds a predetermined value, which of the component mounting machine or the substrate inspection machine is a fault point depending on whether an attribute has changed; and a countermeasure calling section configured to call for a defect countermeasure to the estimated fault point.

7 Claims, 4 Drawing Sheets

(52) U.S. Cl.
CPC ....... *H05K 13/083* (2018.08); *H05K 13/0895* (2018.08); *G06T 2207/30141* (2013.01)

(56) References Cited

FOREIGN PATENT DOCUMENTS

| | | |
|---|---|---|
| EP | 2 922 380 A1 | 9/2015 |
| JP | 10-284900 A | 10/1998 |
| JP | 3772906 B1 * | 5/2006 |
| JP | 2007-157781 A | 6/2007 |
| JP | 2012-248815 A | 12/2012 |
| JP | 2014204058 A * | 10/2014 |
| JP | 6225571 B2 * | 11/2017 |

OTHER PUBLICATIONS

International Search Report dated Oct. 10, 2017 in PCT/JP2017/026790 filed Jul. 25, 2017.

* cited by examiner

| Component type | er (%) | ER (number of) |
|---|---|---|
| A | 5 | 1 |
| B | 15 | 3 |
| C | 0 | 0 |
| D | 0 | 0 |

Dsp1

FIG. 4

| Inspection order of component B | Determination result Good: O Bad: X | Attribute change of component mounting machine |
|---|---|---|
| B1 | X | — |
| B2 | O | — |
| B3 | X | — |
| B4 | X | — |
| B5 | O | Change of lot |
| B6 | O | — |
| B19 | O | — |
| B20 | O | — |

Dsp2

FIG. 5

SUBSTRATE PROCESSING MANAGEMENT SYSTEM

TECHNICAL FIELD

The present specification relates to a system for managing a substrate processing line including a component mounting machine and a substrate inspection machine.

BACKGROUND ART

Techniques for mass-producing circuit substrates by performing various processes (hereinafter referred to as substrate processing) for mounting electronic components (hereinafter referred to as components) on substrates, on which printed wiring is applied, have become widespread. A substrate processing line for processing a substrate includes a component mounting machine for mounting a component on a substrate, a substrate inspection machine for inspecting the mounting state of a component on the substrate, and the like. Generally, a substrate inspection machine performs inspection by image processing image data obtained by imaging a substrate and a component. When the defect rate or the number of defects increase during inspection, it becomes necessary to investigate the fault point and enact a countermeasure. An example of a technique relating to the management of this type of substrate processing line is disclosed in Patent Literature 1.

The component defect determination device of Patent Literature 1 includes a unit for inputting operation status data of each device constituting multiple processes, a unit for determining the stability of each device based on the operation status data, a unit for detecting the failure rate of the component in the last process, and a unit for specifying the cause of failure of the component based on the stability of each device and the failure rate of the component. When the defect rate increases, an unstable device is identified as the cause of the defect, while if all the devices are stable, it is determined that the component itself is defective. With this, the cause of the failure in the mounting process can be specified without providing a new sensor or the like.

PATENT LITERATURE

Patent Literature 1: JP-A-2007-157781

BRIEF SUMMARY

Technical Problem

The criterion for determining the acceptability of a substrate inspection machine is set strictly to achieve a fail-safe condition. That is, the variation range for the determination criterion is set smaller than the maximum allowable tolerance in order to reliably determine that a defective substrate is defective and not erroneously determined to be defective. In this way, substrates whose quality are unknown are provisionally determined to be defective, and only substrates which are reliably determined to be good products are determined to be good. Substrates that are determined to be defective are re-inspected by an operator and the determinations are corrected and determined to be good in many cases. As a result, the determination of a defect in a substrate inspection machine may be erroneous due to the strict determination criterion, in other words, there are cases in which the determination is false. However, there is also a case in which a defective substrate is actually produced due to a problem in the mounting process of the component mounting machine.

The misreporting rate with which defects occur due to an erroneous determination of the substrate inspection machine may increase when the manufacturer, lot, or the like of a component to be mounted is switched. That is, since the shape, color, and the like of the component slightly change due to a difference in the manufacturer, lot, and the like, these may cause an erroneous determination. Information on attributes of the manufacturers, lots, and the like of the components is not necessarily shared by all the substrate processing machines constituting a substrate processing line. In particular, when the manufacturers of multiple substrate processing machines are different from each other, sharing information on attributes becomes complicated. For this reason, it is difficult to estimate the fault point when a defect is determined, and it is difficult to implement prompt a countermeasure.

It is an object of the present specification to provide a substrate processing management system capable of automatically estimating the location of the fault point of a defect and quickly implementing a countermeasure when the defect rate or the number of defective products increases in a substrate processing line.

Solution to Problem

The present specification discloses a substrate processing management system for a substrate processing line including a component mounting machine configured to mount electronic components on a substrate and a substrate inspection machine configured to inspect the mounting state of electronic components mounted on a substrate to determine whether each of the substrates or each of the electronic components is defective, the substrate processing management system comprising: a defect tallying section configured to calculate a defect rate representing a rate of occurrence of substrates or electronic components determined to be defective with the substrate inspection machine, or obtain a number of defective products having substrates or electronic components determined to be defective; an attribute change recognition section configured to recognize when an attribute, among the attributes of the electronic component, having a possibility of affecting the inspection, has changed in the component mounting machine; a fault point estimation section configured to estimate, when the defect rate or the number of defective products exceeds a predetermined value, which of the component mounting machine or the substrate inspection machine is a fault point depending on whether an attribute has changed; and a countermeasure calling section configured to call for a defect countermeasure to the estimated fault point.

Advantageous Effects

With the substrate processing management system disclosed in this specification, when the defect rate or the number of defective products exceeds a predetermined value in the inspection of the substrate inspection machine, the fault point estimation section automatically estimates the fault point in accordance with whether an attribute of the component having a possibility of affecting the inspection has been changed in the component mounting machine. Furthermore, the defect countermeasure calling section calls for a countermeasure to the estimated fault point and the fault point prompts a countermeasure suggestion or supports the formulation of a countermeasure. In this way, it is possible to quickly implement a countermeasure.

DESCRIPTION OF EMBODIMENTS

1. Configuration of Substrate Processing Line 2

Figure 1:
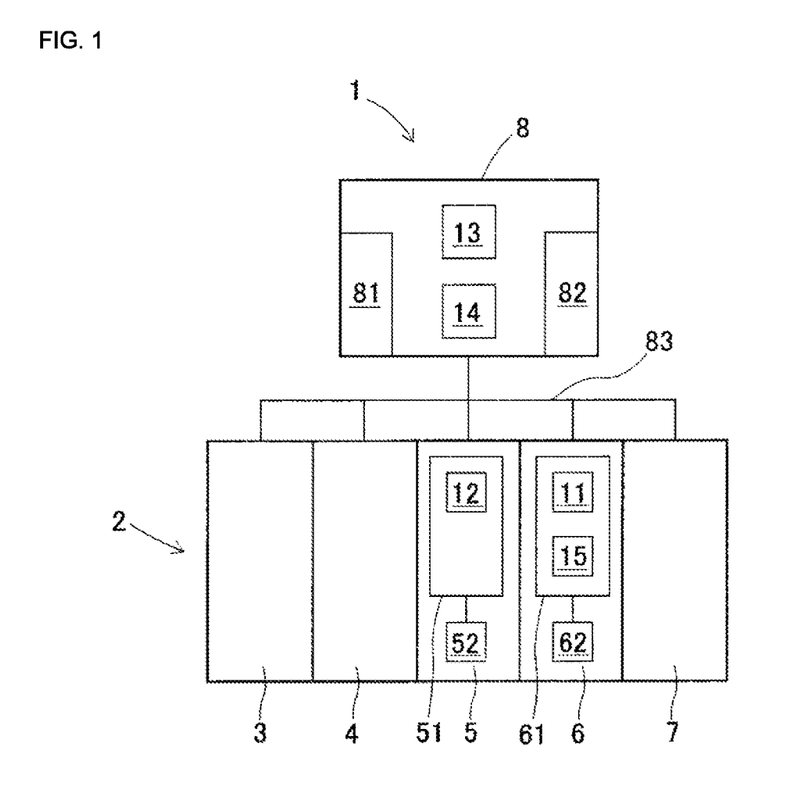
FIG. 1 A diagram showing a schematic configuration of a substrate processing management system and a substrate processing line that is a target of the management.

Substrate processing management system 1 of an embodiment will be described with reference to FIGS. 1 to 5. FIG. 1 is a diagram showing a schematic configuration of substrate processing management system 1 according to the embodiment and substrate processing line 2 that is a target of the management. Substrate processing line 2 mounts a component on a substrate to produce a circuit board. Substrate processing line 2 shown is composed of five substrate processing machines. Specifically, substrate processing line 2 includes solder printing machine 3, solder inspector 4, component mounting machine 5, substrate inspection machine 6, and reflow machine 7 arranged in a row.

Solder printing machine 3 performs a printing process of printing solder paste on a predetermined position of a substrate. Solder printing machine 3 includes a substrate conveyance device, a screen on which a circuit pattern is engraved and placed on a substrate, a squeegee which moves on the screen and applies the solder, and the like. Solder inspection machine 4 performs a solder inspection process for determining whether the printed state of the solder on the substrate is good. Solder inspection machine 4 includes, for example, a substrate conveyance device, an imaging camera for capturing an image of printed solder and acquires image data, and an image determination section for image processing the image data and determining whether the image data is defective.

Component mounting machine 5 performs a mounting process for mounting a component on a substrate. Component mounting machine 5 includes a substrate conveyance device, a component supply device, a component transfer device, a component camera, control section 51, and the like. The substrate conveyance device conveys in a substrate and positions the substrate at a predetermined processing position. When the mounting work is completed, the substrate conveyance device releases the positioning and conveys out the substrate.

The component supply device uses a component holding medium in an exchangeable manner to hold multiple components and sequentially supply the components. The component supply device is configured by arranging multiple feeder devices on a pallet, for example. The feeder device holds a reel on which carrier tape is wound. The carrier tape holds components in multiple component accommodating sections formed between a bottom tape and a cover tape. The feeder device feeds out the carrier tape at a constant pitch and removes the cover tape from the bottom tape to sequentially supply the components.

The component supply device may be a tray-type component supply device using a tray in which multiple components are held in a two-dimensional lattice shape. Alternatively, the component supply device may be a die component supply device that holds and supplies multiple die components produced by dicing a semiconductor wafer on an expanded sheet. Reels, trays, and expanded sheets are examples of component holding media. The component holding medium is exchanged when a component breaks or when the type of component is changed. In addition, the component supply device itself may be exchanged instead of exchanging the component holding medium.

The component transfer device uses a component mounting tool to collect a component from the component supply device, and mounts the component on solder of the substrate. The component transfer device includes a component mounting tool that can be lifted and lowered, a mounting head that can hold the component mounting tool, a driving mechanism that drives the mounting head in two horizontal directions, and the like. Examples of the component mounting tool include a mounting nozzle for picking up a component by using negative pressure, and a clamping-type component mounting tool for clamping a component.

The component camera captures an image of the state in which a component mounting tool has collected a component, acquires image data, and performs image processing on the image data to check the state in which the component has been collected. Control section 51 is configured using a computer device. Control section 51 controls the operations of the substrate conveyance device, the component supply device, the component transfer device, and the component camera. Control section 51 holds component data 52 used for the mounting process.

Component data 52 is set for each component type. Component data 52 includes component shape data, conditions for handling components, and the like. The size and shape of components are set in the shape data. In the handling condition data, the type of component mounting tool to be used, the control method for the lifting/lowering speed and the horizontal moving speed of the component mounting tool, the reference values and tolerances for the position and orientation of the collected component with respect to the component mounting tool, and the like are set.

Substrate inspection machine 6 performs an inspection process for inspecting the mounting state of a component mounted on a substrate. Substrate inspection machine 6 includes a substrate conveyance device, an imaging camera, control section 61, and the like. The imaging camera captures an image of the substrate and the mounted component to acquire image data. Control section 61 is configured using a computer device. Control section 61 controls the operations of the substrate conveyance device and the imaging camera. Further, control section 61 performs a function of an image determination section that performs image processing on the image data to determine whether the image data is acceptable. Control section 61 determines whether the mounting state is good for each component, and also determines when the substrate in question is bad when a defect in a component unit is found. Control section 61 holds inspection data 62 used for the inspection process.

Inspection data 62 is set for each type of component. Inspection data 62 includes reference value data and tolerance data relating to the color of the component. In the case of black-and-white image data, the color is set using a reference value brightness and brightness tolerance. In the case of color image data, the color is set by using a reference value luminance and luminance tolerances for each of the three primary colors of light. The color set in inspection data 62 is used to distinguish and detect the shape of the component from the base of the substrate at the time of image processing.

Inspection data 62 includes reference value data and tolerance data relating to the size and shape of the component. For example, inspection data 62 for a certain chip component is set to a rectangular shape in plan view with a vertical dimension reference value of 0.4 mm, a horizontal dimension reference value of 0.2 mm, and a dimensional tolerance of ±10%. The size and arrangement of connecting electrodes of the component are also included in inspection data 62. The size, shape, and the like of the component set in inspection data 62 are compared with the result obtained by image processing of the image data, from which determination is made whether there is an error in which the component is mixed up with another component.

Further, inspection data 62 includes reference value data and tolerance data relating to the mounting position of the component. The reference value data of the mounting position is set using the X-axis coordinate value and the Y-axis coordinate value on the substrate where the center of the component is located. The tolerance data for the mounting position is set by using the allowed coordinate value error in the X-axis direction and the Y-axis direction. As for the tolerance data for the mounting position, the larger the component, the larger the allowed coordinate value error tends to be. The mounting position of the component set in inspection data 62 and the result obtained by image processing the image data are compared to determine whether the mounting position is good.

Reference values, ideal values, true values, and the like specified in standards, specifications, and the like are used as the reference value data of inspection data 62. On the other hand, the tolerance data is set strictly to achieve a fail-safe condition. That is, a variation range smaller than the specified maximum allowable tolerance is set in the tolerance data. As a result, substrate inspection machine 6 can reliably determine whether a substrate is defective and does not erroneously determine that the substrate is defective. However, false information is generated since a substrate having a characteristic between the maximum tolerance and the set tolerance data is erroneously determined to be defective.

Reflow machine 7 performs a reflow process of heating and melting the solder paste, and then cooling the solder paste. As a result, the soldering portion is ensured to complete the mounting process, thereby producing the circuit substrate. Reflow machine 7 includes, for example, a substrate conveyance device, a heating device, a cooling device, a temperature adjustment device, and the like.

The configuration of substrate processing line 2 described above can be changed, and the structure of each substrate processing machine can also be changed. Host computer 8 is provided to manage the overall operation of substrate processing line 2. Host computer 8 includes display device 81, which is a liquid crystal display or the like for displaying various types of displays, input device 82, which is a keyboard, mouse, and the like for inputting various types of settings. Host computer 8 is connected to and can communicate data individually with solder printing machine 3, solder inspection machine 4, component mounting machine 5, substrate inspection machine 6, and reflow machine 7 using communication line 83. Host computer 8 can also manage multiple processing lines 2 for a substrate collectively.

2. Configuration of Substrate Processing Management System 1 of the Embodiment Substrate processing management system 1 of the embodiment is achieved by combining five software function sections. That is, substrate processing management system 1 includes defect tallying section 11, attribute change recognition section 12, fault point estimation section 13, defect countermeasure calling section 14, and defect-time data presentation section 15. Defect tallying section 11 and defect-time data presentation section 15 are provided in control section 61 of substrate inspection machine 6. Attribute change recognition section 12 is provided in control section 51 of component mounting machine 5. Fault point estimation section 13 and defect countermeasure calling section 14 are provided in host computer 8.

Defect tallying section 11 operates every time inspection processing of one substrate by substrate inspection machine 6 is completed. Defect tallying section 11 calculates the defect rate representing the rate at which substrates or components are determined to be defective in inspection processing. Alternatively, defect tallying section 11 obtains the number of defective substrates or components determined to be defective. Defect tallying section 11 reports the calculated defect rate or the obtained number of defective products to host computer 8.

Attribute change recognition section 12 recognizes that an attribute, among the attributes of the component, having a possibility of affecting the inspection in substrate inspection machine 6, has been changed in component mounting machine 5. Attributes of the component include the manufacturer of the component, the production time for the component, the lot of the component, and the component holding medium. In general, the type of a component is defined by a standard or a specification. However, even if two components are of the same type, if the attributes are different, the shape and color of the components may be slightly different. This subtle difference has the possibility of affecting the defect rate and the number of defective products.

More specifically, attribute change recognition section 12 recognizes that an attribute of the component has been changed upon recognizing that a component holding medium (e.g., a reel, a tray, or an expansion sheet) has been exchanged. Here, component mounting machine 5 has a function of reading an identification code attached to the component holding medium or a function of acquiring the identification code from another device. The identification code includes, in addition to the type of component, information about the attributes of the component. Therefore, attribute change recognition section 12 can easily recognize when an attribute of a component has been changed. Each time an attribute of a component is changed, attribute change recognition section 12 reports the change to host computer 8. Attribute change recognition section 12 reliably and without delay recognizes the change of an attribute of a component by using a recognition method for registering the exchange of a component holding medium.

Fault point estimation section 13 operates when the defect rate or the number of defective products exceeds a predetermined value. Fault point estimation section 13 estimates that substrate inspection machine 6 is the fault point when an attribute of a component is changed in component mounting machine 5. More specifically, fault point estimation section 13 estimates that inspection data 62 is the fault point when a trend of increasing defect rate or number of defective products becomes remarkable in substrate inspection machine 6 and exceeds a predetermined value, after an attribute of the component is changed in component mounting machine 5. That is, since the shape, the color, and the like of the component have changed slightly with the change in the attribute, it is supposed that the magnitude of the defect has increased due to the subtle change. In other words, it is presumed that inspection data 62 does not match the change in the attribute of the component.

For example, the actual dimensions of a component may become slightly larger as the manufacturer changes, and the actual dimensions may shift from the reference value data of inspection data 62. In addition, variations in the actual dimensions of the component may spread within the maximum tolerance range due to differences in the manufacturing timing, and may deviate from the tolerance data. Further, the color changes subtly as the lot is changed, and the detection accuracy of the shape of the component may deteriorate. In these cases, even if the defective substrate is determined to be defective in inspection processing, the substrate may not actually be defective, and only false information is generated. The cause of the false information is not the mounting processing of component mounting machine 5 but the fact that inspection data 62 does not match the actual state of the component.

On the other hand, fault point estimation section 13 estimates that component mounting machine 5 is the fault point when no attribute of the component is changed in component mounting machine 5. That is, if the defect rate or the number of defective products increases despite the fact that an attribute of the component has not changed, it is presumed that mounting processing by component mounting machine 5 is the cause. For example, wear and modification of the component mounting tool of component mounting machine 5, and deterioration of position control accuracy of the drive mechanism can be considered as possible causes.

Defect countermeasure calling section 14 operates following the operation of fault point estimation section 13. Defect countermeasure calling section 14 calls for a countermeasure for the defect to the estimated fault point, that is, component mounting machine 5 or substrate inspection machine 6.

Defect-time data presentation section 15 operates in response to an instruction from host computer 8 when the defect rate or the number of defective products exceeds a predetermined value. Defect-time data presentation section 15 presents data relating to the execution state of the inspection. In the present embodiment, defect-time data presentation section 15 displays on a display section (not shown) of substrate inspection machine 6 various types of data when a defect is found during inspection processing and image data during inspection processing. The various types of data displayed and image data are utilized in the formulation of a countermeasure.

3. Operation of Substrate Processing Management System 1 of the Embodiment

Figure 2:
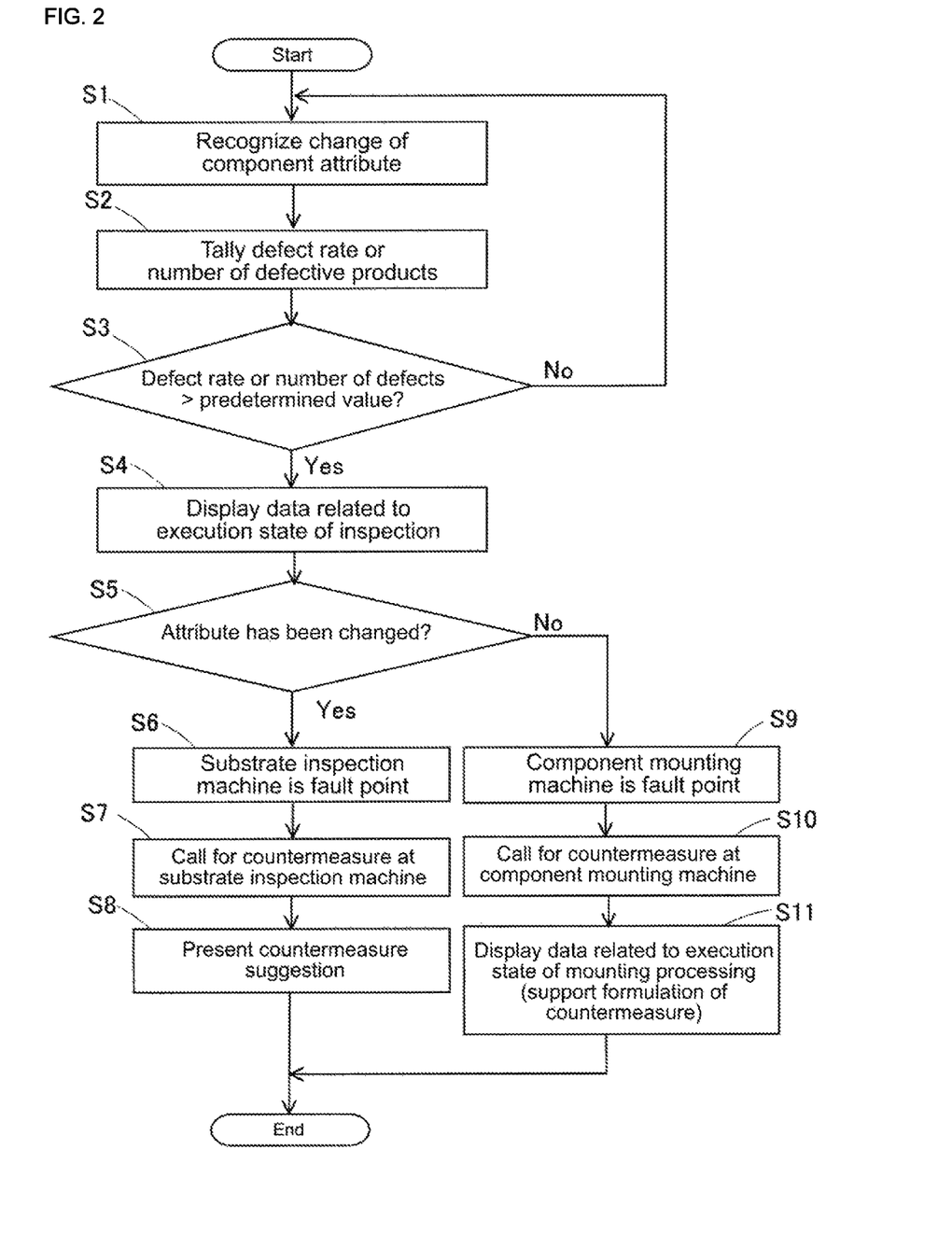
FIG. 2 A flow chart showing the operational flow of the substrate processing management system.

Next, the operation of substrate processing management system 1 according to the embodiment will be described. FIG. 2 is a flowchart showing the operational flow of substrate processing management system 1. In the flow chart of FIG. 2, the loop from step S1 to step S3 is executed each time substrate processing of each substrate processing machine of substrate processing line 2 is completed and a substrate is conveyed between the devices. Further, the steps from step S4 onward are executed when the defect rate or the number of defective products in substrate inspection machine 6 exceeds a predetermined value.

In step S1 of FIG. 2, attribute change recognition section 12 recognizes changes in attributes of a component in component mounting machine 5 sequentially. In practice, it is more likely that no attribute changes occur during mounting processing on a single substrate. In the next step, S2, defect tallying section 11 totals the latest defect rates or the number of defective products based on the inspection result of one substrate. In the next step, S3, defect tallying section 11 determines whether the defect rate or the number of defective products exceeds a predetermined value. If the defect rate or the number of defective products does not exceed a predetermined value, defect tallying section 11 returns the execution of the operational flow to step S1.

Figure 3:
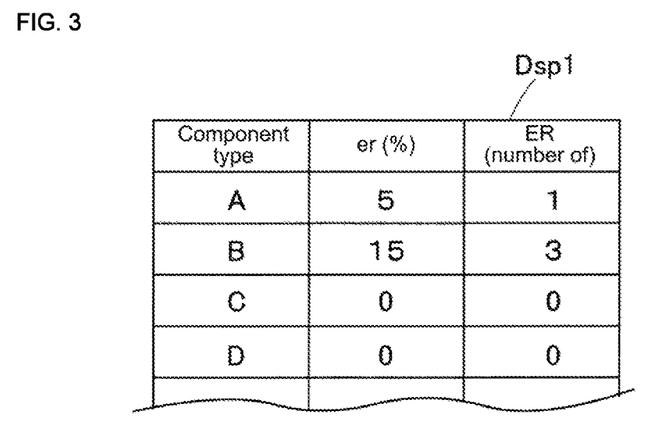
FIG. 3 A diagram of a display screen of defect tallying data displayed by a defect-time data presentation section.
Figure 4:
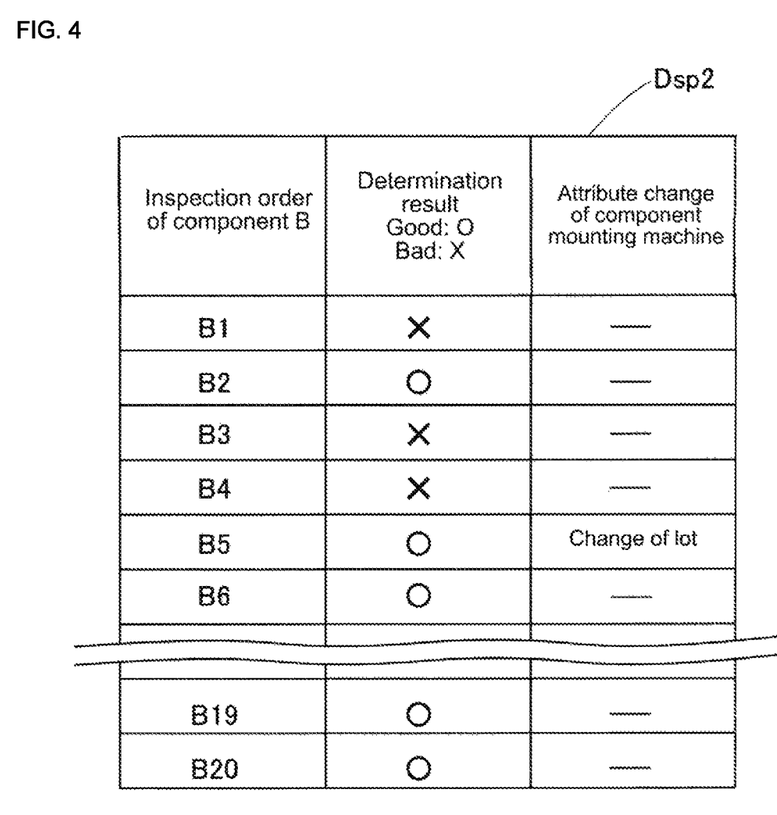
FIG. 4 A diagram of a display screen of defect detail data, displayed by a defect-time data display section, that can be shifted from the display screen of the defect tallying data.

When the defect rate or the number of defective products exceeds a predetermined value, defect tallying section 11 advances the execution of the operational flow to step S4. In step S4, defect data presentation section 15 shows data relating to the execution state of the inspection. FIG. 3 is a diagram showing display screen Dsp1 of defect tallying data displayed by defect data presentation section 15. FIG. 4 is a diagram of display screen Dsp2 of defect detail data displayed by defect data presentation section 15, which can be shifted from display screen Dsp1 of the defect tallying data.

In the defect tallying data of FIG. 3, defect rate er and number of defective products ER of component types A to D are displayed on display screen Dsp1. In this display example, the last twenty inspection processes of each component type are used in the population. In practice, larger populations are used. As shown in the figure, defect rate er of component type A is 5% and number of defective products ER is 1, which is less than the predetermined value. However, defect rate er of component type B is 15% and number of defective products ER is 3, each exceeding the predetermined value. In addition, defect rate er and number of defective products ER of component types C and D are zero indicating a good state. Here, when the cursor is moved to the stage of component type B and the cursor is clicked, display screen Dsp1 shifts to display screen Dsp2 of defect detail data shown in FIG. 4.

In the defect detail data of FIG. 4, details of the execution state of inspection processing, from which defect rate er of component type B is calculated, are displayed. That is, the inspection order of twenty components B1 to B20 of component type B and quality determination results are displayed in the sequence in time. In this display example, the upper rows show the newer execution status while the lower row show the execution status in reverse to the past. Further, the timing and the content of attribute changes in component mounting machine 5 are also displayed in display screen Dsp2.

As shown in FIG. 4, the determination results are good (O) from the oldest component B20 to component B5, four components before the most recent component. On the other hand, in component mounting machine 5, after mounting component B5, which is four components before the most recent component, the lot of component type B is changed. The determination result of component B4 mounted immediately after the lot change is defective (x), the determination result of the next component B3 is also defective (x), and the determination result of component B2 after component B3 is good (o). The determination result of component B1 inspected at the current time is defective (x) and defect rate er of component type B has increased to 15%. In this case, defect rate er changes when the lot of component type B changes.

Figure 5:
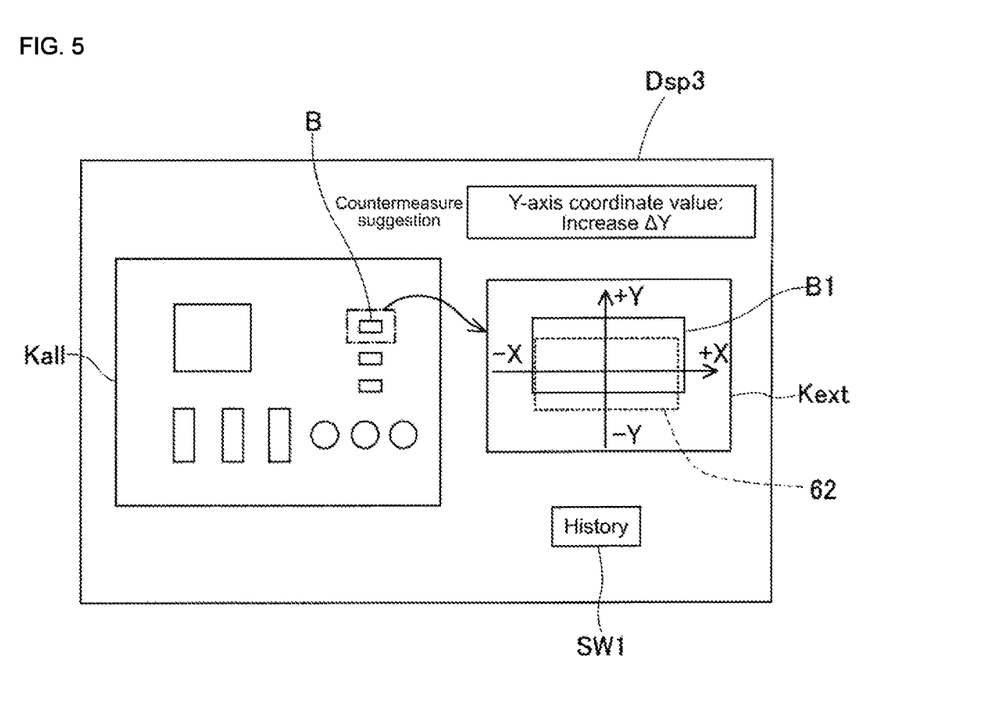
FIG. 5 A diagram of the display screen of an example of image data displayed by the defect-time data presentation section.

In the next step, S5, fault point estimation section 13 determines whether there was a change in a component attribute in component mounting machine 5. If an attribute has changed as shown in FIG. 4, fault point estimation section 13 advances the execution of the operational flow to step S6. In step S6, fault point estimation section 13 estimates that substrate inspection machine 6 is the fault point. In the next step, S7, defect countermeasure calling section 14 calls for a defect countermeasure at substrate inspection machine 6. In response to the call, defect data presentation section 15 displays image data effective for formulating a countermeasure. FIG. 5 is a diagram showing display screen Dsp3, an example of image data displayed by defect data presentation section 15.

On the left side of display screen Dsp3 of FIG. 5, image data Kall, representing all image data when the substrate is inspected, is displayed. Further, on the right side of display screen Dsp3, enlarged image data Kext obtained by enlarging an area in the vicinity of component type B of the substrate is displayed. In enlarged image data Kext, the size and mounting position of a component of component type B set in inspection data 62 are indicated with a broken line. Further, the actual dimensions and the mounting position of component B1 of component type B inspected at this time are displayed with a solid line.

In the case shown in FIG. 5, the size of component B1 in enlarged image data Kext is slightly larger than inspection data 62, but is within a range determined to be good. On the other hand, the mounting position of component B1 in enlarged image data Kext is greatly shifted from inspection data 62 in the +Y-axis direction. In this manner, substrate inspection machine 6 determines a defect in the mounting position of component B1. If the size of component B1 deviates from the tolerance of inspection data 62, substrate inspection machine 6 determines that the size of component B1 is defective.

Software switch SW1 labeled "History" is provided below the enlarged image data. By clicking software switch SW1, enlarged image data Kext is displayed in the order of component B2, component B3, and component B4, . . . , and so on. As a result, the operator can confirm the mounting state of the component determined to be defective and the mounting state of the component determined to be good. Since the state of the defect becomes clear by such a visual check function, defect data presentation section 15 is effective in formulating a countermeasure.

In the next step, S8, control section 61 of substrate inspection machine 6 analyzes the current and previous occurrence of defects and presents a countermeasure suggestion. More specifically, control section 61 registers the mounting position largely shifted in the +Y-axis direction at the time of failure, and develops a countermeasure to increase the Y-axis coordinate value of the mounting position of inspection data 62 by $\Delta Y$. Naturally, this countermeasure suggestion is within the maximum allowable tolerance for ensuring the performance of the substrate. Control section 61 displays this countermeasure suggestion above enlarged image data Kext.

If it is determined that the shape is defective due to a defect such as the size of the component of component type B, control section 61 presents a countermeasure suggestion for correcting the shape data of inspection data 62. As described above, when inspection data 62 is the fault point, the defect is analyzed and a countermeasure suggestion for correcting inspection data 62 is presented so that a countermeasure can be implemented quickly. Instead of the countermeasure suggestion being presented by control section 61, the operator may consider a countermeasure suggestion by checking three screens (Dsp1, Dsp2, Dsp3).

When there is no attribute change in step S5, fault point estimation section 13 advances the execution of the operational flow to step S9. In step S9, fault point estimation section 13 estimates that component mounting machine 5 is the fault point. In the next step, S10, defect countermeasure calling section 14 calls for a defect countermeasure at component mounting machine 5. In the next step, S11, control section 51 of component mounting machine 5 displays the data on the execution state of current and previous mounting processes on the display section (not shown) to support the formulation of a countermeasure.

For example, control section 51 displays imaging data from the component camera and historical data of handling conditions with which the components were handled. By checking this display, the operator can efficiently consider various courses of action with respect to component mounting machine 5, such as investigating or inspecting component mounting machine 5, or performing maintenance or exchanging parts, and then implement those actions. This makes it possible to quickly implement a countermeasure when component mounting machine 5 is the fault point. After steps S8 or S11, the operational flow ends.

With substrate processing management system 1 of the embodiment, when the defect rate or the number of defective products exceeds a predetermined value in the inspection of substrate inspection machine 6, fault point estimation section 13 automatically estimates the fault point in accordance with whether the attribute of the component having the possibility of affecting the inspection has been changed in component mounting machine 5. Furthermore, defect countermeasure calling section 14 calls for a countermeasure to the estimated fault point and the fault point prompts a countermeasure suggestion or supports the formulation of a countermeasure. In this way, it is possible to quickly implement a countermeasure.

4. Application and Modification of the Embodiment

The division of functions of substrate processing management system 1 of the embodiment is not limited to the above-mentioned embodiment. For example, substrate processing management system 1 does not require host computer 8, and the five software function sections can be implemented by using control section 51 of component mounting machine 5 and control section 61 of substrate inspection machine 6. Further, the three display screens (Dsp1, Dsp2, Dsp3) shown as examples may be displayed on display device 81 of host computer 8 or a display section (not shown) of component mounting machine 5. Furthermore, substrate processing management system 1 according to the embodiment can be applied to substrate processing line 2 including multiple component mounting machines 5. Various other applications and modifications of the embodiment are possible.

REFERENCE SIGNS LIST

1: Substrate processing management system, 11: Defect tallying section, 12: Attribute change recognition section, 13: Fault point estimation section, 14: Defect countermeasure calling section, 15: Defect data presentation section, 2: Substrate processing line, 3: Solder printing machine, 4:

Solder inspector, 5: Component mounting machine, 51: Control section, 6: Substrate inspection machine, 61: Control section, 62: Inspection data, 7: Reflow machine, 8: Host computer, er: Defect rate, ER: Number of defective products

The invention claimed is:

1. A substrate processing management system for a substrate processing line including a component mounting machine configured to mount electronic components on a substrate and a substrate inspection machine configured to inspect a mounting state of the electronic components mounted on the substrate to determine whether the substrate or each of the electronic components is defective, the substrate processing management system comprising:
   a defect tallying section configured to calculate a defect rate representing a rate of occurrence of the substrate or the electronic components determined to be defective with the substrate inspection machine, or obtain a number of defective products including the substrate or the electronic components determined to be defective;
   an attribute change recognition section configured to recognize when an attribute, among the attributes of the electronic components having a possibility of affecting an inspection, has changed in the component mounting machine;
   a fault point estimation section configured to estimate, when the defect rate or the number of defective products exceeds a predetermined value, which of the component mounting machine or the substrate inspection machine is a fault point depending on whether the attribute has changed; and
   a countermeasure calling section configured to call for a defect countermeasure to the fault point.

2. The substrate processing management system of claim 1, wherein
   the fault point estimation section is configured to estimate that the substrate inspection machine is the fault point when the attribute has changed, and to estimate that the component mounting machine is the fault point when the attribute has not changed.

3. The substrate processing management system of claim 2, wherein
   the substrate inspection machine is configured to hold an inspection data set for each type of the electronic components for use in the inspection; and
   wherein the fault point estimation section is configured to estimate that the inspection data held in the substrate inspection machine is the fault point when the attribute has changed.

4. The substrate processing management system of claim 3, wherein
   the substrate inspection machine is configured to perform the inspection by imaging the electronic components mounted on the substrate to acquire image data and then perform image processing on the image data using the inspection data; and
   wherein the inspection data includes reference value data and tolerance data, which relates to a size, shape, and color of the electronic components.

5. The substrate processing management system of claim 1, wherein
   the component mounting machine uses a component holding medium, in an exchangeable manner, configured to hold the electronic components, and
   the attribute change recognition section is configured to recognize that the attribute has been changed by recognizing that the component holding medium has been exchanged.

6. The substrate processing management system of claim 1, wherein
   the substrate processing management system further comprises a data presentation section configured to present data relating to an execution state of the inspection when the defect rate or the number of defective products exceeds the predetermined value.

7. The substrate processing management system of claim 1, wherein
   the attribute of the electronic components includes a manufacturer of the electronic components, a production time for the electronic components, a lot of the electronic components, and a component holding medium holding the electronic components.

* * * * *